United States Patent
Tsai et al.

(10) Patent No.: US 9,000,821 B2
(45) Date of Patent: Apr. 7, 2015

(54) ASYMMETRIC DELAY CIRCUIT

(71) Applicant: MStar Semiconductor, Inc., Hsinchu Hsien (TW)

(72) Inventors: Huimin Tsai, Hsinchu Hsien (TW); Yu-Min Yeh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/054,907

(22) Filed: Oct. 16, 2013

(65) Prior Publication Data
US 2014/0111265 A1 Apr. 24, 2014

(30) Foreign Application Priority Data
Oct. 23, 2012 (TW) .............................. 101139083 A

(51) Int. Cl.
*H03H 11/26* (2006.01)
*H03K 5/159* (2006.01)
*H03K 5/04* (2006.01)

(52) U.S. Cl.
CPC . *H03K 5/159* (2013.01); *H03K 5/04* (2013.01)

(58) Field of Classification Search
USPC ................. 327/263, 264, 261, 294, 172–176
See application file for complete search history.

(56) References Cited

U.S. PATENT DOCUMENTS

| | | | | | |
|---|---|---|---|---|---|
| 4,800,295 | A | * | 1/1989 | Minuhin et al. | 327/176 |
| 4,905,192 | A | * | 2/1990 | Nogami et al. | 365/200 |
| 5,309,034 | A | * | 5/1994 | Ishibashi | 327/174 |
| 5,396,110 | A | * | 3/1995 | Houston | 327/172 |
| 5,764,090 | A | * | 6/1998 | Yeh et al. | 327/174 |
| 5,864,251 | A | * | 1/1999 | Bloker et al. | 327/172 |
| 6,707,331 | B1 | * | 3/2004 | Nguyen | 327/166 |
| 6,924,681 | B2 | * | 8/2005 | Staszewski et al. | 327/172 |
| 6,956,420 | B2 | * | 10/2005 | Slawecki | 327/172 |
| 7,379,356 | B2 | * | 5/2008 | Piorkowski | 365/196 |
| 7,420,398 | B1 | * | 9/2008 | Tung et al. | 327/174 |
| 7,852,134 | B2 | * | 12/2010 | Moon | 327/172 |
| 2004/0243871 | A1 | * | 12/2004 | Nieuwland et al. | 713/401 |
| 2013/0076424 | A1 | * | 3/2013 | Mohammad et al. | 327/263 |

* cited by examiner

*Primary Examiner* — Lincoln Donovan
*Assistant Examiner* — Thomas Skibinski
(74) *Attorney, Agent, or Firm* — Edell, Shapiro & Finnan, LLC

(57) ABSTRACT

A delay circuit for receiving an input signal and generating a delayed output signal. The delay circuit includes a first delay module and a second delay module. The first delay module includes a first delay unit for generating a first delayed signal according to an input signal and a first logic unit, coupled to the first delay unit, for generating a first delayed output signal according to the first delayed signal and the input signal. The second delay module includes a second delay unit for generating a second delayed signal according to the first delayed output signal and a second logic unit, coupled to the second delay unit, for generating the delayed output signal according to the second delayed signal and the input signal.

6 Claims, 8 Drawing Sheets

US 9,000,821 B2

ASYMMETRIC DELAY CIRCUIT

CROSS REFERENCE TO RELATED APPLICATIONS

This application claims priority under 35 U.S.C 119 to Taiwan patent application, TW101139083, filed on Oct. 23, 2012, the disclosure of which is incorporated herein by reference.

BACKGROUND OF THE INVENTION

1. Field of the Invention

The present invention relates to digital circuitry, and more particularly, to a delay circuit having asymmetric delay times.

2. Description of the Prior Art

In the field of digital circuitry, it is very important to control timing synchronization. General speaking, many digital circuits are controlled by an enable signal. For example, in case of memory access, in addition to a memory address to be accessed, control logic is required to generate an enable signal to an associated memory controller. Upon receiving the enable signal, the memory controller starts to access the addressed memory.

Normally, a memory controller is activated to perform an access operation if the enable signal is raised by control logic. Conversely, the memory controller stops an access operation if the enable signal is pulled down. When the enable signal is raised again by control logic, memory controller begins a next access operation. In order to prevent error operations, control logic and/or memory are usually required to wait for a predetermined amount of time to enable states of the internal circuit components to stabilize before beginning to perform a next access operation.

For this purpose, a traditional delay circuit 100 shown in FIG. 1 is adopted in the prior art for delaying an enable signal IN for a device 110 to be activated. As a result, activation timing of the device 110 is determined by a delayed enable signal IN_D. Please also refer to FIG. 2, juxtaposes the enable signal IN, and a voltage level of the delayed enable signal IN_D transiting from low to high delays for a delay time T1, which is caused by delay elements 101 to 106.

Although the delay circuit 100 guarantees that the device 100 performs a next round operation after states of internal circuits are stabilized, such a circuit wastes too much time in waiting. This is because the design of the delay circuit 100 delays the same time no matter whether the enable signal is raised or pulled down. However, in most applications, only where the enable signal IN is raised or transits from low to high voltage level, is it necessary to wait for states of circuits to stabilize. In other words, there is no need to introduce delay in the case where the enable signal IN falls or transits from a high to low voltage level. Nevertheless, as shown in FIG. 2, the delay circuit 100 shown in FIG. 1 delays the enable signal T1 time when the enable signal IN transits from a high to low voltage level. As a result, the circuit delays too much in continuous operations of the device 100 and degrades operating efficiency.

SUMMARY OF THE INVENTION

Accordingly, the present invention provides a delay circuit having asymmetric delay times. The delay circuit of the present invention provides different delay effects for a rising transition and a falling transition of an input signal.

One embodiment of the present invention provides a delay circuit for receiving an input signal and generating a delayed output signal. The delay circuit comprises a first delay module and a second delay module. The first delay module comprises a first delay unit for generating a first delayed signal according to an input signal and a first logic unit, coupled to the first delay unit, for generating a first delayed output signal according to the first delayed signal and the input signal. The second delay module comprises a second delay unit for generating a second delayed signal according to the first delayed output signal and a second logic unit, coupled to the second delay unit, for generating the delayed output signal according to the second delayed signal and the input signal.

As a consequence of such a configuration, in case the input signal is raised for activating a specified device controlled by the input signal, the delay circuit of the present invention can provide longer delay time for the specified device until internal components of the specified device are stabilized. For deactivating operation of the specified device, the delay circuit of the present invention can provide a shorter delay time for the input signal. Hence the falling transition of the input signal can be sent quickly to the specified device for deactivation.

DETAILED DESCRIPTION OF THE PREFERRED EMBODIMENTS

Figure 1:
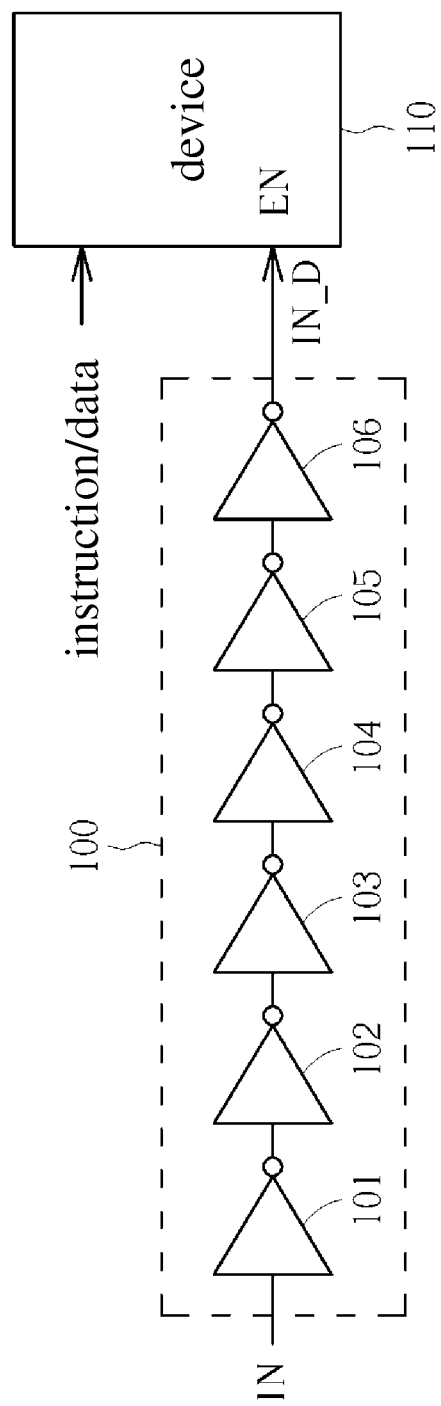
FIG. 1 shows a diagram of a traditional delay circuit.
Figure 2:
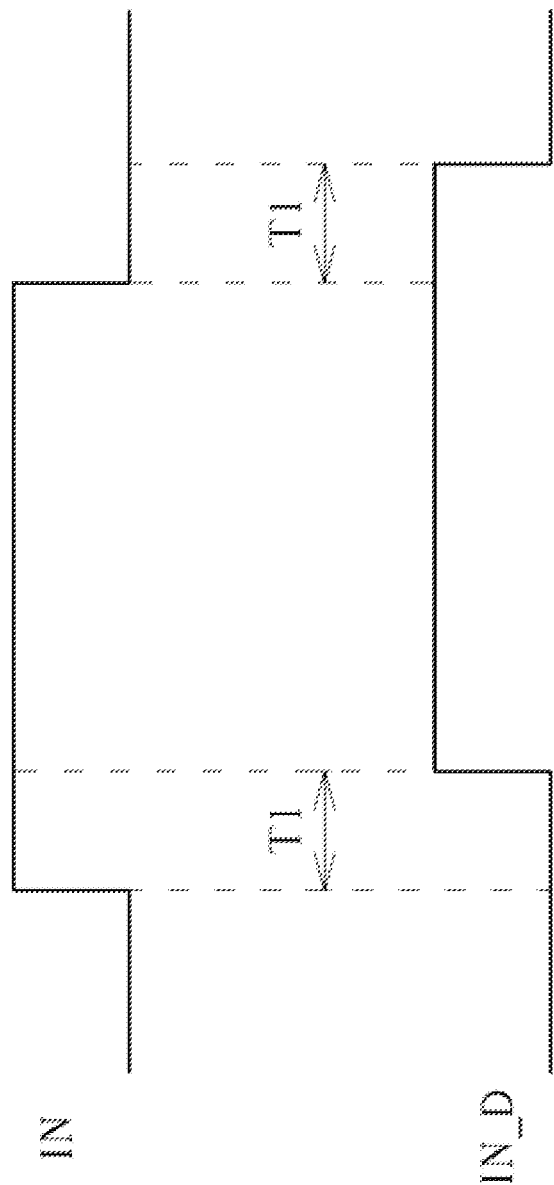
FIG. 2 depicts a timing diagram of a delayed signal with respect to an input signal generated by the traditional delay circuit shown in FIG. 1.
Figure 3:
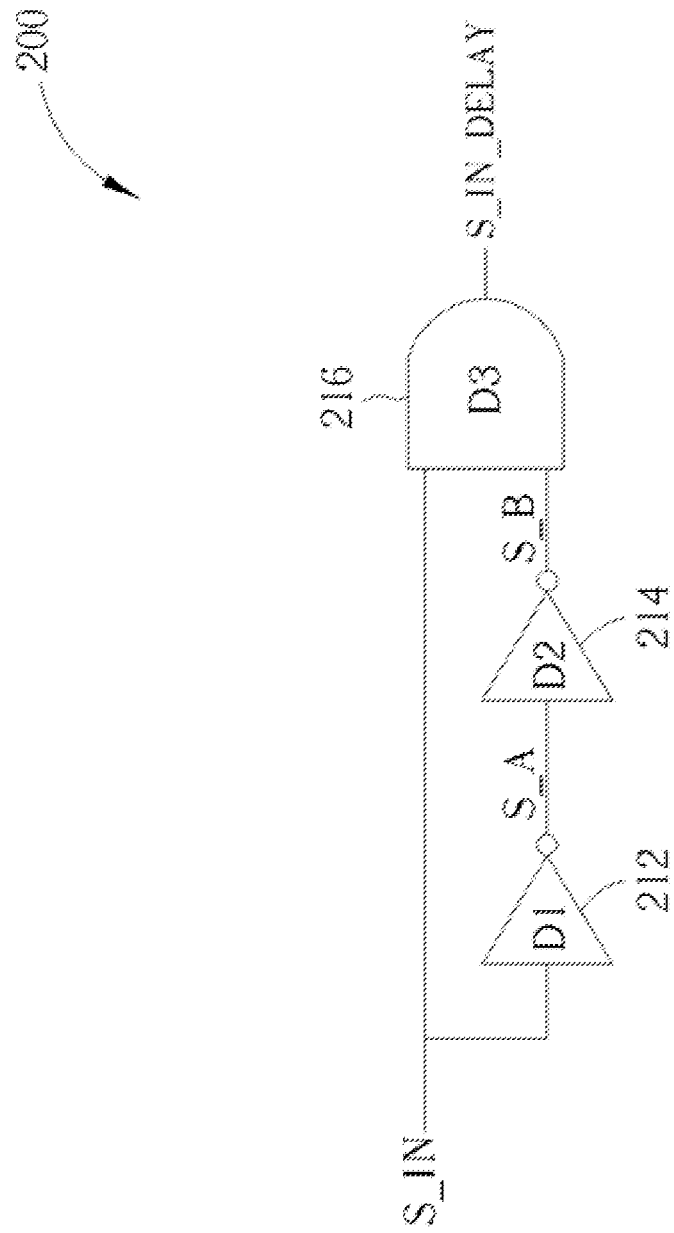
FIG. 3 illustrates a schematic diagram of a delay module according to an embodiment of the present invention.
Figure 4:
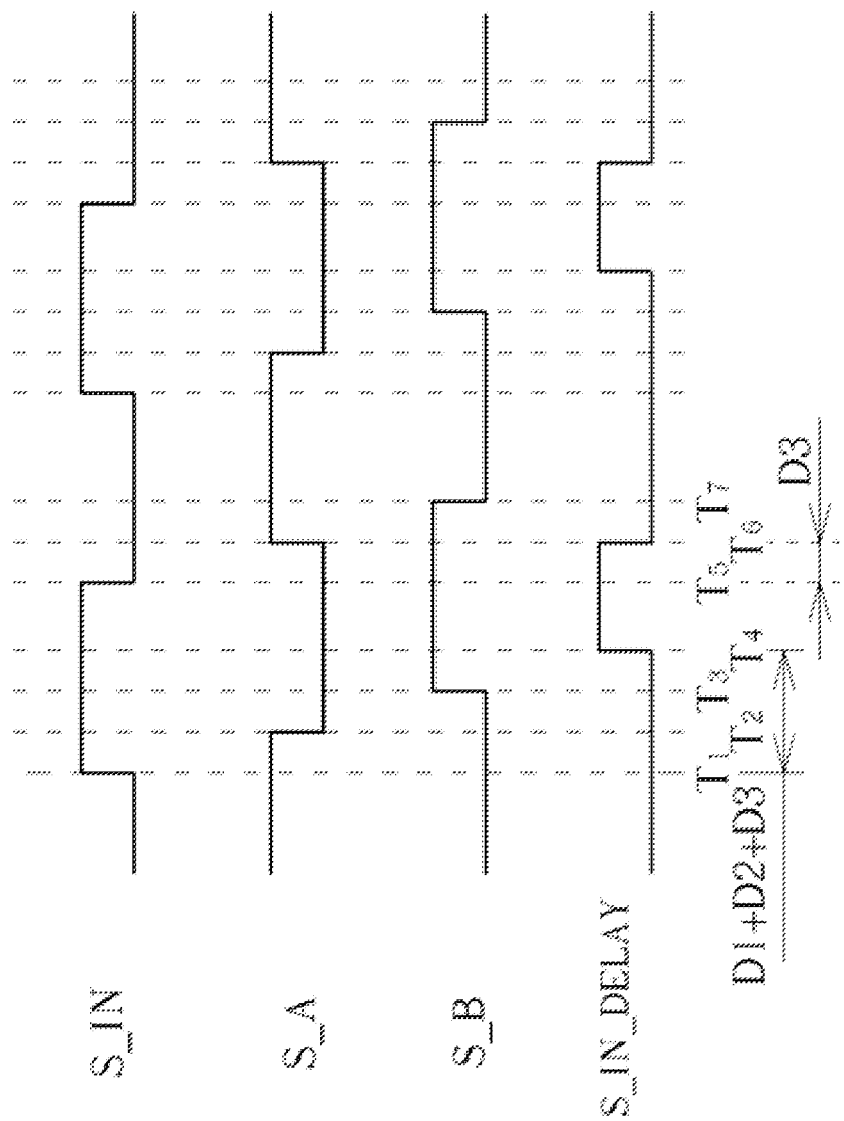
FIG. 4 illustrates a timing diagram of signals at multiple points of the delay module shown in FIG. 3.

In order to solve the problem addressed in the prior art, multiple small delay modules are used to replace traditional delay circuits consisting of many delay elements. Reference is made to FIG. 3 and FIG. 4, which show a schematic diagram of a delay module in accordance with an embodiment of the present invention and a timing diagram with respect to signals at multiple points in the delay module, respectively. At timing point $T_1$, an input signal S_IN rises. Since state of the input signal S_IN is at low level prior to timing point $T_1$, output signal S_IN_DELAY of an AND gate 216 is at low level. When signal S_IN rises at timing point $T_1$, an output signal S_A of a delay unit 212 transits from high to low level until timing point $T_2$ due to delay effect of the delay unit 212 itself. Similarly, an output signal S_B of a delay unit 214 transits its state at timing point $T_3$ due to delay effect of the delay unit 214 itself. Since both inputs of the AND gate 216 are at high level at this timing point, an output signal S_IN_DELAY of the AND gate 216 transits from initial low level to high level in response to the rising of input signal S_IN. Moreover, because of delay effect of the AND gate 216, the output signal S_IN_DELAY rises at timing point $T_4$ after timing point $T_3$. Thus, in the case where the input signal S_IN rises, total delay time caused by the delay module 200 is ($T_4-T_1$) which equals to the sum (in unit of time) of delay effects D1, D2, and D3 caused by the delay unit 212, 214, and the AND gate 216, respectively. However, in the case where the input signal S_IN falls, the delay module 200 provides a totally different delay effect.

Reference is again made to FIG. 3 and FIG. 4. At timing point $T_5$, the input signal S_IN falls. Since both inputs of the AND gate 216 are at a high level prior to timing point $T_5$, the output signal S_IN_DELAY is at a high level. At timing point $T_5$, one input of the AND gate 216 receives the input signal S_IN having low level. Consequently, the output signal S_IN_DELAY of the AND gate 216 transits from high to low level quickly. Considering delay effect of the AND gate 216 itself, the output signal S_IN_DELAY of the AND gate 216 falls at timing point $T_6$ after timing point $T_5$. Thus, total delay time caused by the delay module 200 is ($T_6-T_5$) which is equivalent to delay effect D3 of the AND gate 216 itself. As a result, by using the delay module provided by the present invention, different delay times for rising delay and falling delay are generated. Comparing with the traditional delay circuit 100 having the same rising delay and falling delay time, the delay module in the present invention largely decreases the falling delay. Taking the traditional delay circuit 100 as an example, both of the rising delay and the falling delay are caused by total delay effect 6*D of six delay elements 101 to 106. Alternatively, if implementing the traditional delay circuit 100 by two of delay module 200 shown in FIG. 3, it generates total delay effect 6*D corresponding to the raising delay by assuming (D1=D2=D3=D, in unit of time). For falling delay, the delay circuit embodied the delay module provided by the present invention generates merely delay effect D which is a sixth of total delay effect of traditional delay circuit 100. Hence, the operating speed can be largely increased if realizing the delay circuit by the delay module provided by the present invention.

Figure 5:
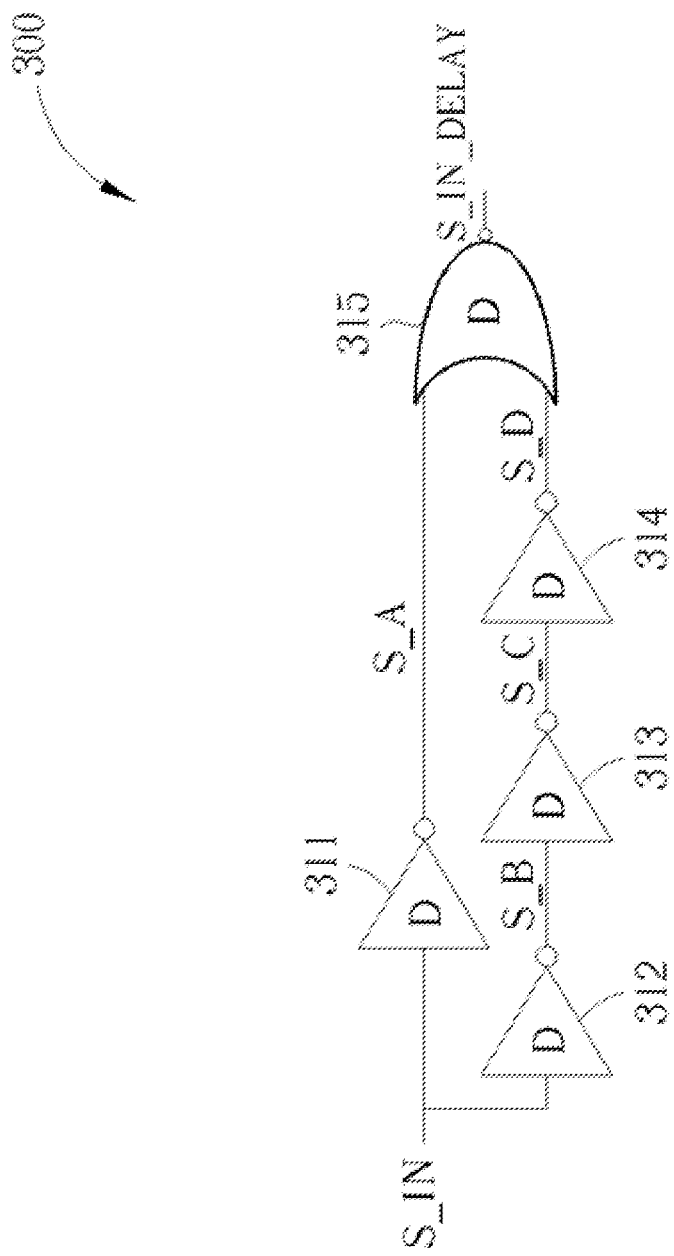
FIG. 5 illustrates a schematic diagram of a delay module according to an embodiment of the present invention.
Figure 6:
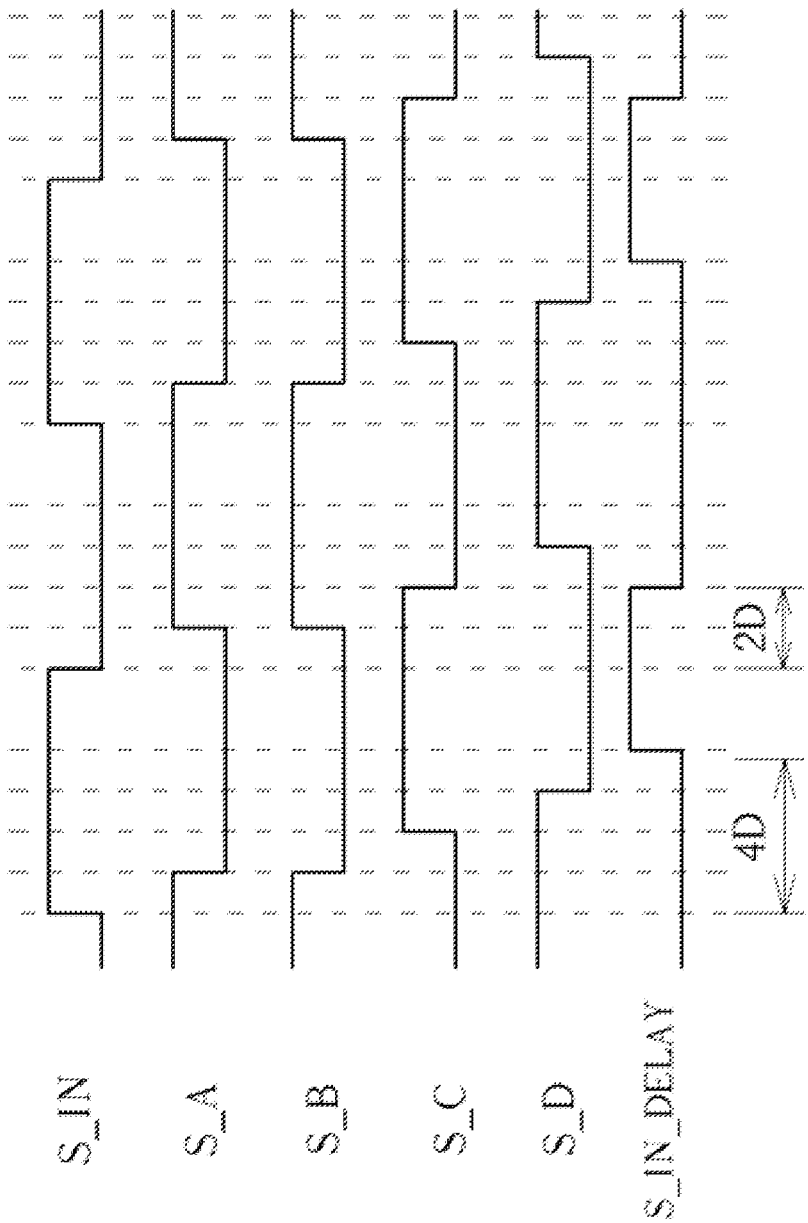
FIG. 6 illustrates a timing diagram of signals at multiple points of the delay module shown in FIG. 5.

In addition to the fore-mentioned embodiment, the delay module of the present invention may be realized by other implementations. Reference is made to FIG. 5 and FIG. 6 which show a schematic diagram of a delay module in accordance with another embodiment of the present invention and a timing diagram of the delay module, respectively. According to FIG. 5, outputting a delayed output signal S_IN_DELAY, a delay module 300 generates a total rising delay 4D caused by delay units 312, 313, and 314 as well as NOR gate 315 (assuming delay effect caused by each component is equal) in response to raising of an input signal S_IN. Additionally, in response to falling of the input signal S_IN, the delayed output signal S_IN_DELAY is generated and delayed a total falling delay 2D caused by the delay unit 311 and the NOR gate 315.

From the two embodiments described above, those skilled in the art will appreciate that the delay module in the present invention may be realized by any other combinations of circuit equivalent to performing AND operation on both input signals. For example, the delay module 200 performs AND operation on the input signal S_IN. Although the delay module 300 performs an inverse operation on the input signal S_IN at first, by utilizing a NOR operation performed by the NOR gate 325 on the inversed signal, the output signal substantially equals to the outcome of performing AND operation on the input signal S_IN. In summary, the number and types of logic gates as well as the number of delay units described in the instant description and figures should not be construed as limiting the present invention. Furthermore, although the delay units shown in the figures are represented by inverters, any other circuits having delay effect may be used to implement delay units in other embodiments according to the present invention.

Figure 7:
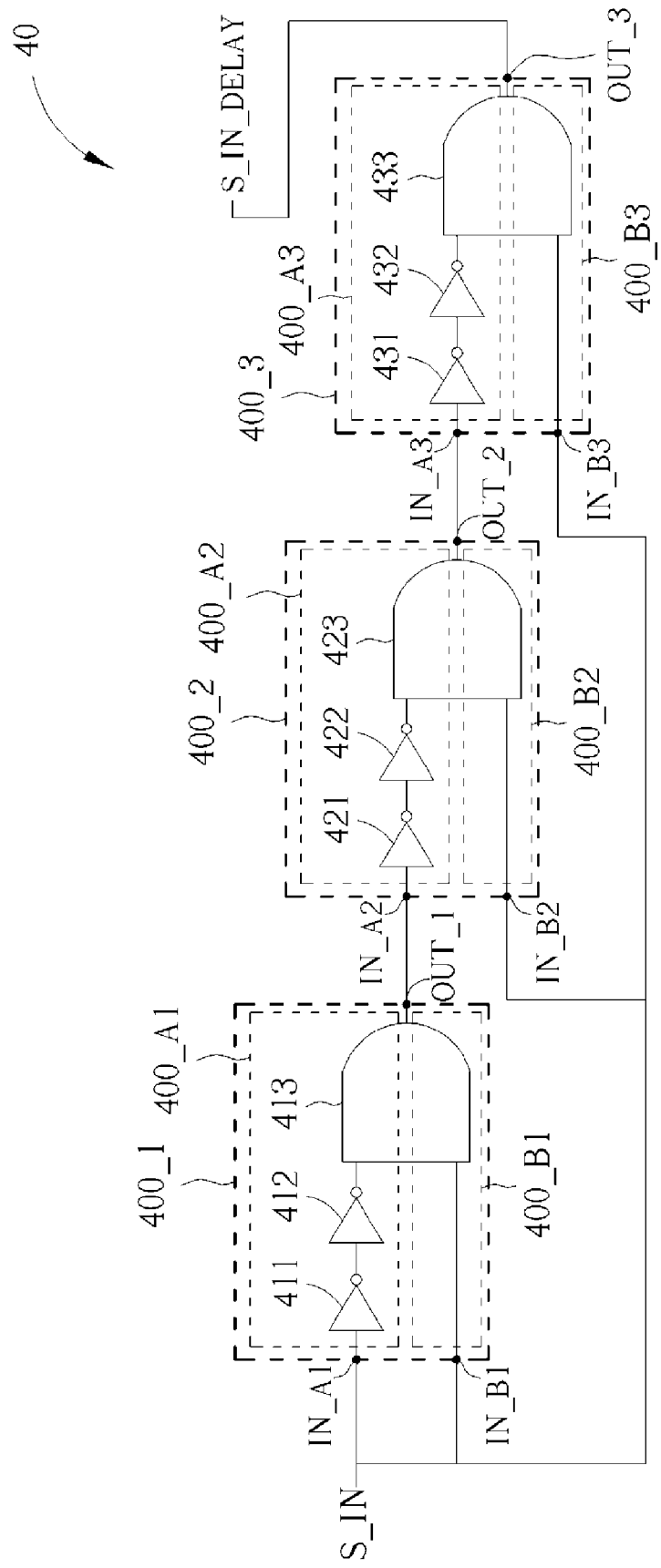
FIG. 7 illustrates a schematic diagram of a delay circuit according to another embodiment of the present invention.

The delay module in the present invention may be further combined as a delay circuit 40 as shown in FIG. 7 used to delay an input signal S_IN. Structure of the delay circuit 40 shown in FIG. 7 comprises delay modules 400_1 to 400_3. Each delay module comprises multiple delay units and a logic gate. Each delay module has input ends IN_A1 to IN_A3 and IN_B1 to IN_B3 as well as output ends OUT_1 to OUT_3. These delay modules 400_1 to 400_3 are interconnected in series. The delay modules 400_1 to 400_3 comprises first signal paths 400_A1 to 400_A3 and second signal paths 400_B1 to 400_B3, respectively, for providing different delay effects corresponding to rising and falling of the input signal S_IN. Taking the delay module 400_1 as an example, the first signal path 400_A1 is a path from the input end IN_A1 to the output end OUT_1 through delay units 411, 412, and logic gate 413. The second signal path 400_B1 is a path from the input end IN_B1 to the output end OUT_1 via the logic gate 413.

Except for the last stage of delay module 400_3, the output end of each delay module is coupled to the input end of delay module in next stage. Similarly, except for the first stage of delay module 400_1, the input end of each delay module receives output of delay module in a previous stage in addition to the input signal S_IN. Based on such a configuration, in the case where the input signal S_IN rises, the delay circuit 40 generates the delayed output signal S_IN_DELAY in total of delay effects T1+T2+T3 of the first signal path 400_A1 to 400_A3 of the delay modules 400_1 to 400_3. In the case where the input signal S_IN falls, the delay circuit 40 generates the delayed output signal S_IN_DELAY according to the delay effect T3 of the second signal path 400_B3 of the last stage of delay module 400_3. It is noted that although the descriptions and figures above utilize the delay module shown in FIG. 3 to implement the delay circuit 40, it may utilize the delay module shown in FIG. 5 to implement the delay circuit 40 in other embodiments of the present invention.

Figure 8:
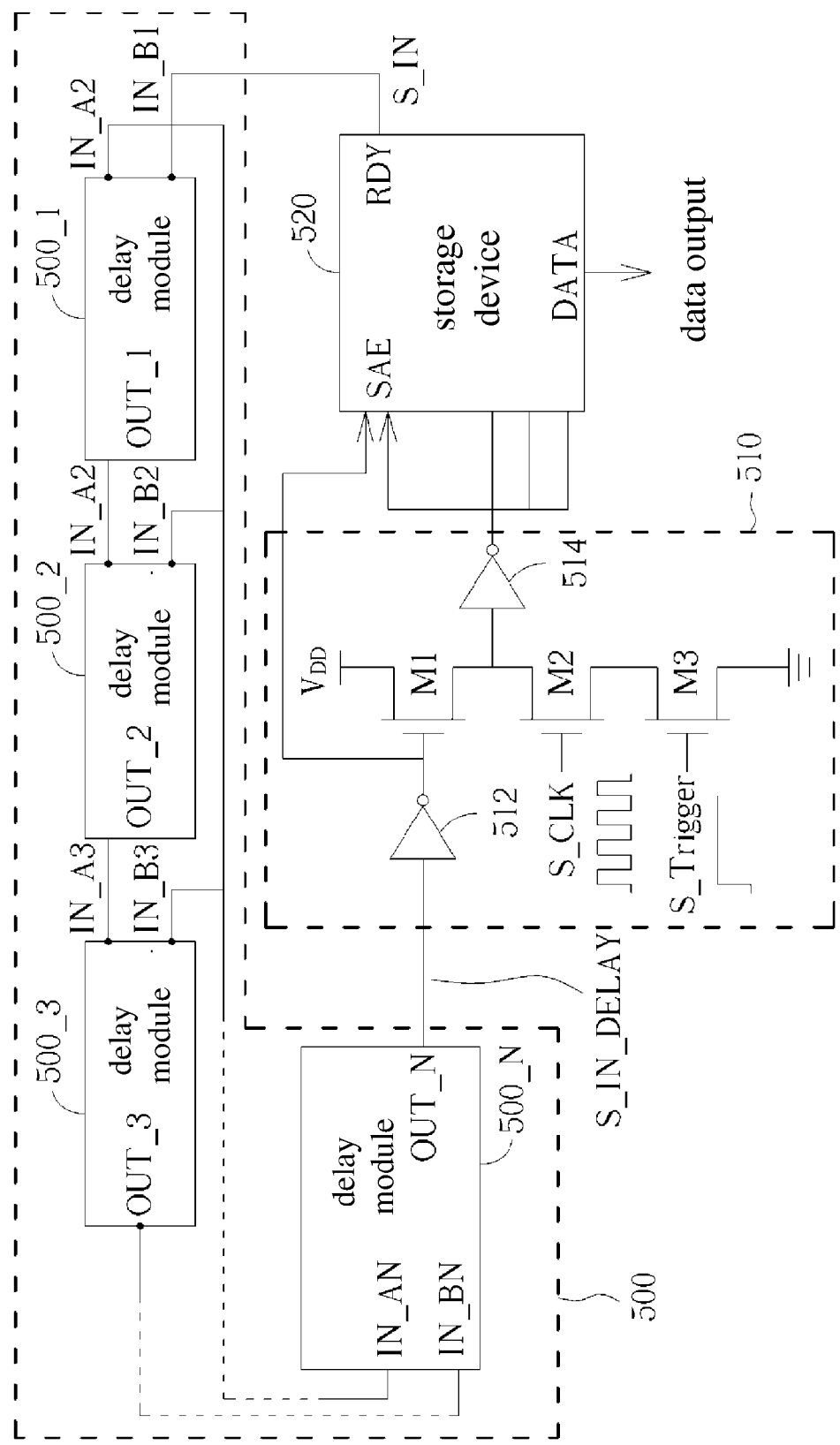
FIG. 8 depicts an application including a delay circuit in accordance with an embodiment of the present invention.

With respect to real applications of the delay circuit in accordance with the present invention, the embodiment shown in FIG. 8 may be referenced. FIG. 8 depicts an access operation to a storage device 520. The activating and de-activating timings of such an access operation are determined by an enable signal generator circuit 510. In the case where a signal at a connection port SAE of the storage device 520 is raised, a sensing amplifier (not shown in FIG. 8) of the storage device 520 amplifies the signal read from memory units of the storage device 520 and outputs the amplified signal to an output port DATA as a data access operation. When the data access operation is complete, an output port RDY generates a falling signal to notify the enable signal generator circuit 510 that the data read operation is finished. The storage device 520 is then ready for a next access operation.

Control logic comprising transistors M1, M2, and M3 is used to determine when to raise the signal at the input port SAE for the access operation according to the output signal S_IN of the output port RDY, a clock signal S_CLK, and a trigger signal S_Trigger. In case the signal at the input port SAE is raised, the signal of output port RDY is also raised because the storage device is performing the access operation. A delay circuit 500 comprising delay modules 500_1 to 500_N delays level transition of signal S_IN at the output port RDY in order to generate a delayed output signal S_IN_DELAY to delay the raising of signal S_IN at the output port RDY. The delay prevents output instability of the control logic comprising transistors M1, M2, and M3 when a next pulse of the clock signal S_CLK arrives.

Comparing with the signal S_IN at the output port RDY, the delayed output signal S_IN_DELAY generated by the delay circuit 500 is asymmetric in rising delay and falling delay. Therefore, the delay circuit 500 can not only provide sufficient rising delay to prevent output instability of the control logic consisted of transistors M1, M2, and M3 but can also quickly reflect a falling transition to end operation of the storage device 520 when the access operation of the storage device 520 is finished. As a result, the waiting time for next access operation is shortened so latency of continuous operations of the storage device 520 is also decreased and the reading/writing rate of the storage device 520 is elevated. It is noted that although in the description above, the delay circuit in accordance with the present invention is used to shorten the delay time for one way of voltage level transition, specifically, falling transition from high to low level, the present invention is not so limited. By adopting appropriate modifications, e.g., adding inverters, it is possible for the delay circuit provided by the present invention to decrease the delay time of a rising transition of an input signal.

In summary, the delay circuit of the present invention provides different delay effects for a rising transition and falling transition of an input signal. Hence, it is effective to decrease the latency of continuous operations of circuits and to increase performance of circuits.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A memory system comprising:
   a storage device comprising:
      an input port SAE;
      an output port RDY;
      an output port DATA;
   an enable signal generator, coupled to the storage device, for generating an enable signal to the input port SAE; and
   a delay circuit, coupled to the storage device and the enable signal generator, for receiving an input signal from the output port RDY and generating a delayed output signal to the enable signal generator, wherein the output port RDY signal provides a falling signal to notify the enable signal generator that a data read operation from the storage device is finished, the delay circuit comprising:
      a first delay module comprising:
         a first delay unit for generating a first delayed signal according to an input signal; and
         a first logic unit, coupled to the first delay unit, for generating a first delayed output signal according to the first delayed signal and the input signal; and
      a second delay module comprising:
         a second delay unit for generating a second delayed signal according to the first delayed output signal; and
         a second logic unit, coupled to the second delay unit, for generating the delayed output signal according to the second delayed signal and the input signal,
      wherein when the input signal transits from a first state to a second state, the delayed output signal is delayed for a first delay time with respect to the input signal; and when the input signal transits from the second state to the first state, the delayed output signal is delayed for a second delay time with respect to the input signal, the first delay time and the second delay time being different.

2. The delay circuit of claim 1, wherein one of the first delay unit and the second delay unit comprises a plurality of inverters connected in series.

3. The delay circuit of claim 1, wherein one of the first delay module and the second delay module comprises a first signal path and a second signal path, wherein a first signal delay is generated by the first signal path and a second signal delay is generated by the second signal path.

4. The delay circuit of claim 3, wherein the first delay time is determined according to the first signal delays of the first delay module and the second delay module, and the second delay time is determined according to the second signal delays of the first delay module and the second delay module.

5. The delay circuit of claim 1, wherein one of the first logic unit and the second logic unit is an AND gate.

6. The delay circuit of claim 1, wherein one of the first logic unit and the second logic unit is a NOR gate.

* * * * *